United States Patent
Chang et al.

(10) Patent No.: US 12,416,749 B2
(45) Date of Patent: Sep. 16, 2025

(54) DIFFRACTIVE OPTICAL ELEMENT AND METHOD FOR FABRICATING THE DIFFRACTIVE OPTICAL ELEMENT

(71) Applicant: HIMAX TECHNOLOGIES LIMITED, Tainan (TW)

(72) Inventors: Chih-Sheng Chang, Tainan (TW); Meng-Ko Tsai, Tainan (TW); Chung-Kai Sheng, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 18/459,434

(22) Filed: Sep. 1, 2023

(65) Prior Publication Data
US 2023/0408740 A1 Dec. 21, 2023

Related U.S. Application Data

(62) Division of application No. 16/589,021, filed on Sep. 30, 2019, now Pat. No. 11,782,195.

(51) Int. Cl.
*G02B 5/18* (2006.01)
*G03F 7/00* (2006.01)

(52) U.S. Cl.
CPC ......... *G02B 5/1852* (2013.01); *G03F 7/0002* (2013.01); *G03F 7/001* (2013.01); *G02B 5/1876* (2013.01); *G02B 5/188* (2013.01)

(58) Field of Classification Search
None
See application file for complete search history.

(56) References Cited

U.S. PATENT DOCUMENTS

| 6,320,837 | B1 * | 11/2001 | Ohyama | G11B 7/1353 |
| 7,871,741 | B2 | 1/2011 | Nemeth et al. | |
| 2002/0141006 | A1 | 10/2002 | Pocius et al. | |
| 2008/0074746 | A1 | 3/2008 | Cumme | |
| 2009/0011141 | A1 * | 1/2009 | Carter | B82Y 40/00 427/552 |
| 2009/0051003 | A1 * | 2/2009 | Cheng | H01L 23/5256 257/529 |

(Continued)

FOREIGN PATENT DOCUMENTS

| CN | 105119141 A | * | 12/2015 |
| CN | 108254823 A | * | 7/2018 |

(Continued)

*Primary Examiner* — Martin J Angebranndt
(74) *Attorney, Agent, or Firm* — CKC & Partners Co., LLC

(57) ABSTRACT

A diffractive optical element and method for fabricating the diffractive optical element are provided. The diffractive optical element includes a substrate, a first diffractive structure layer and a second diffractive structure layer. The substrate has a first surface and a second surface opposite to the first surface. The first diffractive structure layer is disposed on the first surface of the substrate. The second diffractive structure layer is disposed on the second surface of the substrate. In the method for fabricating the diffractive optical element, at first, the substrate is provided. Then, a first glue material layer/first semiconductor layer is formed and patterned on the first surface of the substrate. Thereafter, a second glue material layer/second semiconductor layer is formed and patterned on the second surface of the substrate.

3 Claims, 8 Drawing Sheets

(56) References Cited

U.S. PATENT DOCUMENTS

| | | |
|---|---|---|
| 2009/0053408 A1 | 2/2009 | Chien |
| 2009/0180186 A1 | 7/2009 | Ando et al. |
| 2012/0272721 A1* | 11/2012 | Kochupurackal .. G01N 33/0037 257/253 |
| 2015/0318013 A1 | 11/2015 | Kitahara et al. |

FOREIGN PATENT DOCUMENTS

| | | | |
|---|---|---|---|
| CN | 109782382 A * | 5/2019 | |
| JP | 2001059905 A * | 3/2001 | ......... G02B 27/4238 |
| JP | 2003348384 A | 12/2003 | |
| JP | 3541575 B2 * | 7/2004 | |
| JP | 2007273013 A * | 10/2007 | ........... G02B 5/1866 |
| JP | 2012212019 A | 11/2012 | |
| TW | 201910816 A | 3/2019 | |
| TW | 201910915 A | 3/2019 | |
| WO | 2019066873 A1 | 4/2019 | |

* cited by examiner

DIFFRACTIVE OPTICAL ELEMENT AND METHOD FOR FABRICATING THE DIFFRACTIVE OPTICAL ELEMENT

RELATED APPLICATIONS

The present application is a Divisional Application of the U.S. application Ser. No. 16/589,021, filed Sep. 30, 2019, which is herein incorporated by reference.

BACKGROUND

Field of Invention

The present invention relates to a diffractive optical element and a method for fabricating the diffractive optical element.

Description of Related Art

A diffractive optical element is a well-known optical element that utilizes light diffraction phenomenon to achieve various optical functions, for example, a light converging function, a light diverging function, a light distribution function, a wavelength filtering function, and a spectroscopic function. Specifically, in a structured-light projector, a diffractive optical element is used to receive a light beam and generate an optical pattern on a target. However, the diffractive optical element has a high light loss rate (about 40%).

Therefore, there is a need for a diffractive optical element having a lower light loss rate.

SUMMARY

Embodiments of the present invention provide a diffractive optical element having a low light loss rate. The diffractive optical element includes a substrate, a first diffractive structure layer and a second diffractive structure layer. The substrate has a first surface and a second surface opposite to the first surface. The first diffractive structure layer is disposed on the first surface of the substrate. The second diffractive structure layer is disposed on the second surface of the substrate.

In some embodiments, the diffractive optical element further includes a protection layer disposed on the first diffractive structure layer. A difference between a refractive index of the first diffractive structure layer and a refractive index of the protection layer is bigger than 0.25.

In some embodiments, the refractive index of the first diffractive structure layer is smaller than the refractive index of the protection layer.

In some embodiments, the first diffractive structure layer and the second diffractive structure layer are semiconductor layers.

In some embodiments, material of the first diffractive structure layer and the second diffractive structure layer comprises silicon oxide or silicon nitride.

In some embodiments, the first diffractive structure layer and the second diffractive structure layer are glue material layers.

In some embodiments, one of the first diffractive structure layer and the second diffractive structure layer is configured to depress noise at zero order.

In some embodiments, the substrate is a glass substrate.

From another aspect, embodiments of the present invention provide a method for fabricating a diffractive optical element. In the method, at first, a substrate is provided, in which the substrate has a first surface and a second surface opposite to the first surface. Then, a first glue material layer is formed on the first surface of the substrate. Thereafter, the first glue material layer is patterned to form a first diffractive structure layer on the first surface of the substrate. Then, a protection layer is formed on the first diffractive structure layer. Thereafter, a second glue material layer is formed on the second surface of the substrate. The second glue material layer is patterned to form a second diffractive structure layer on the second surface of the substrate.

In some embodiments, the method further including reversing the substrate before forming the second glue material layer, in which a platform of a tool configured to form the second glue material layer touches the protection layer to support the substrate after reversing the substrate.

In some embodiments, the steps of patterning the first glue material layer and patterning the second glue material layer are performed by using nanoimprint technology.

In some embodiments, a difference between a refractive index of the first glue material layer and a refractive index of the protection layer is bigger than 0.25.

In some embodiments, the refractive index of the first glue material layer is smaller than the refractive index of the protection layer.

In some embodiments, one of the first diffractive structure layer and the second diffractive structure layer is patterned to depress noise at zero order.

In some embodiments, the substrate is a glass substrate.

From further another aspect, embodiments of the present invention provide a method for fabricating a diffractive optical element. In the method, at first, a substrate is provided, in which the substrate has a first surface and a second surface opposite to the first surface. Then, a first semiconductor layer is formed on the first surface of the substrate. Thereafter, the first semiconductor layer is patterned to form a first diffractive structure layer on the first surface of the substrate. Then, a second semiconductor layer is formed on the second surface of the substrate. Thereafter, the second semiconductor layer is patterned to form a second diffractive structure layer on the second surface of the substrate.

In some embodiments, the method further including reversing the substrate before forming the second semiconductor layer, in which a platform of a tool configured to form the second semiconductor layer touches the first diffractive structure layer to support the substrate after reversing the substrate.

In some embodiments, the steps of patterning the first semiconductor layer and patterning the second semiconductor layer are performed by using nanoimprint technology.

In some embodiments, one of the first diffractive structure layer and the second diffractive structure layer is patterned to depress noise at zero order.

In some embodiments, the substrate is a glass substrate, and the material of the first semiconductor material containing layer and the second semiconductor material containing layer comprises silicon oxide or silicon nitride.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

The using of "first", "second", "third", etc. in the specification should be understood for identifying units or data described by the same terminology but are not referred to particular order or sequence.

Figure 1:
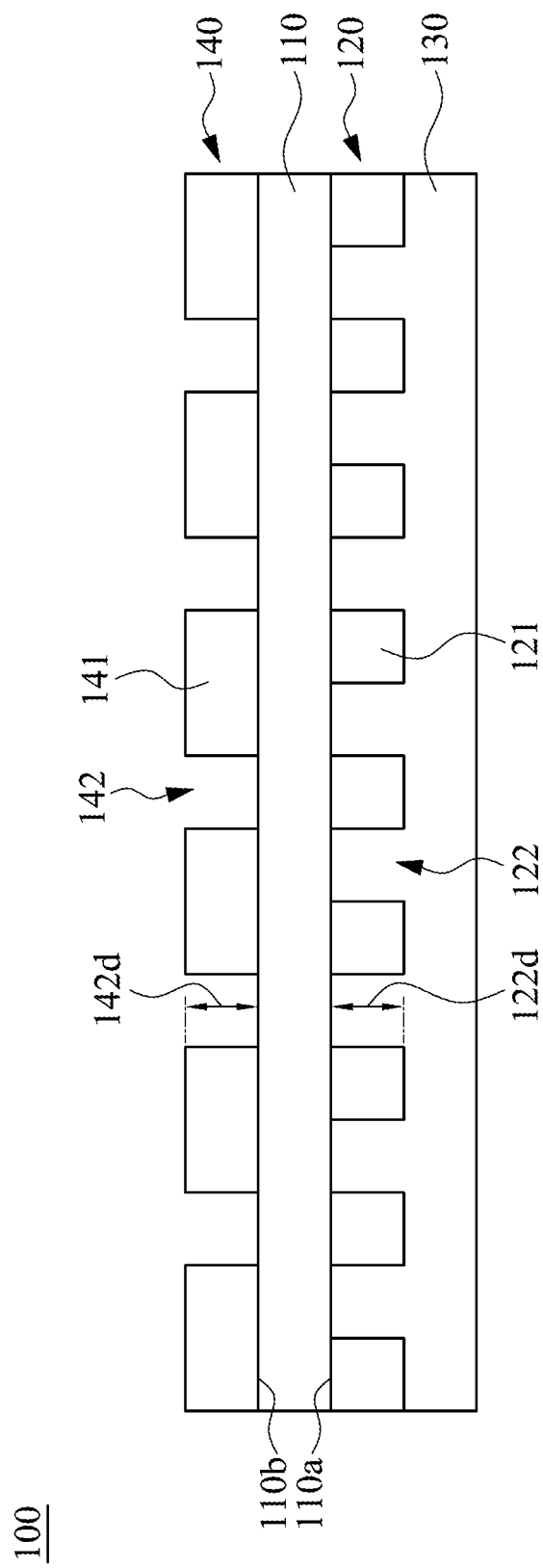
FIG. 1 is a schematic diagram showing a structure of a diffractive optical element (DOE) in accordance with embodiments of the present invention.

FIG. 1 is a schematic diagram showing a structure of a diffractive optical element (DOE) 100 in accordance with embodiments of the present invention. The diffractive optical element 100 includes a substrate 110, a first diffractive structure layer 120, a protection layer 130 and a second diffractive structure layer 140. The substrate 110 has a first surface 110a and a second surface 110b opposite to the first surface 110a. In this embodiment, the substrate 110 is a glass substrate, but embodiments of the present invention are not limited thereto.

The first diffractive structure layer 120 is disposed on the first surface 110a of the substrate 110. The first diffractive structure layer 120 has plural micro structures including plural main portions 121 and openings 122 between the main portions 121. Each of the openings 122 has a depth 122d. Similarly, the second diffractive structure layer 140 is disposed on the second surface 110b of the substrate 110. The second diffractive structure layer 140 has plural micro structures including plural main portions 141 and openings 142 between the main portions 141. Each of the openings 142 has a depth 142d.

In some embodiments, the first diffractive structure layer 120, the protection layer 130 and the second diffractive structure layer 140 are made from a glue material such as epoxy type glue, acrylic type glue or silicone type glue. In some embodiments, the first diffractive structure layer 120 and the second diffractive structure layer 140 are semiconductor material containing layers made from silicon nitride or silicon oxide. In some embodiments, a difference between a refractive index of the first diffractive structure layer 120 and a refractive index of the protection layer 130 is bigger than 0.25, and the refractive index of the first diffractive structure layer 120 is smaller than the refractive index of the protection layer 130.

In some embodiments, one of the first diffractive structure layer 120 and the second diffractive structure layer 140 is configured to depress noise at zero order, and the other one of the first diffractive structure layer 120 and the second diffractive structure layer 140 is configured to generate a desired light pattern on a target. For example, the first diffractive structure layer 120 is configured to depress noise at zero order and the second diffractive structure layer 140 is configured to generate the desired light pattern on the target.

In some embodiments, one of the first diffractive structure layer 120 and the second diffractive structure layer 140 is configured to generate a portion of the desired light pattern, and the other one of the first diffractive structure layer 120 and the second diffractive structure layer 140 is configured to generate the other portion of the desired light pattern, thereby enabling the diffractive optical element 100 to generate the desired light pattern on the target.

In some embodiments, the openings 122 of the first diffractive structure layer 120 are aligned with the openings 142 of the second diffractive structure layer 140, and a size of each of the main portions 121 of the first diffractive structure layer 120 is equal to the main portions 141 of the second diffractive structure layer 140. The openings 122 and/or the openings 142 are formed to have a maximum depth allowed in a lithography process. For example, when a maximum depth allowed in the lithography process is D, each of the openings 122 may have a depth equal to D and each of the openings 142 may have a depth equal to D/2. However, embodiments of the present invention are not limited thereto. In some embodiments, each of the openings 122 and the openings 142 may have a depth equal to D.

Figure 2:
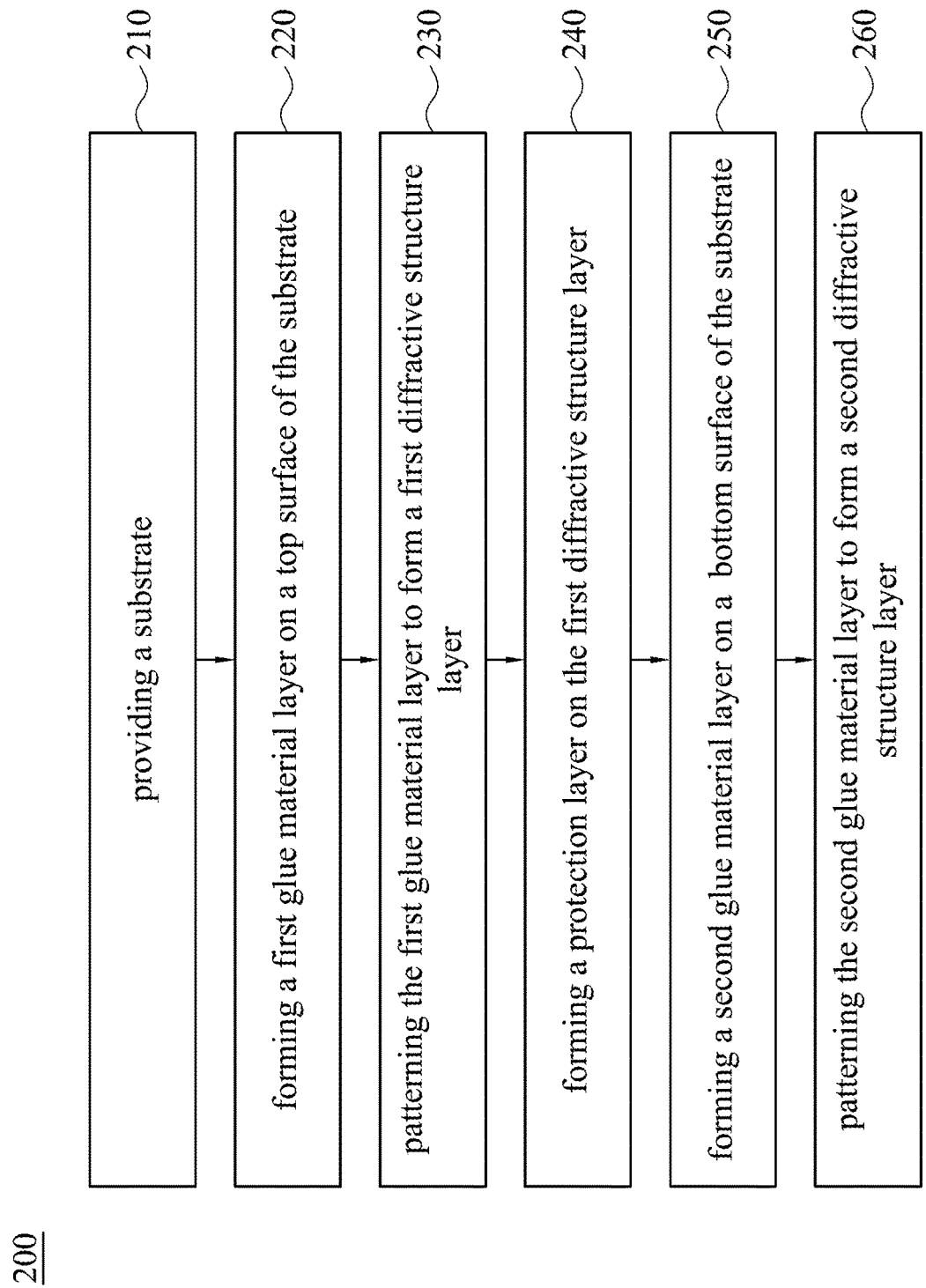
FIG. 2 is a flow chart showing a method for fabricating the diffractive optical element in accordance with an embodiment of the present invention.
Figure 3A:
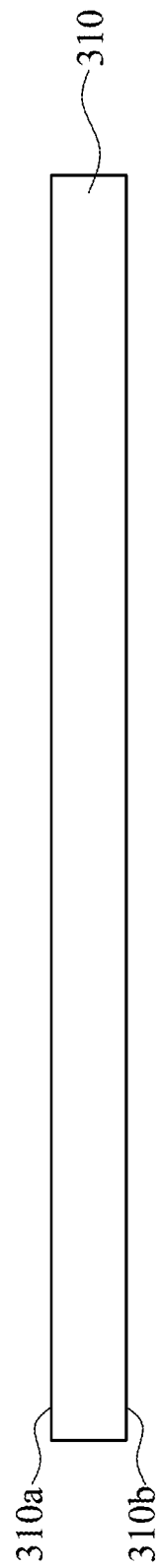
FIG. 3A to FIG. 3F are schematic diagrams showing intermediate stages in the fabricating of the diffractive optical element in accordance with embodiments of the present invention.

Referring to FIG. 2, FIG. 2 is a flow chart showing a method 200 for fabricating the diffractive optical element 100 in accordance with an embodiment of the present invention. In the method 200, at first, step 210 is performed to provide a substrate 310, as shown in FIG. 3A. The substrate 310 has a first surface 310a (top surface) and a second surface 310b (bottom surface) opposite to the first surface 310a. In this embodiment, the substrate 310 is a glass substrate, but embodiments of the present invention are not limited thereto.

Figure 3B:

Then, step 220 is performed to form a first glue material layer 320 on the first surface 310a of the substrate 310, as shown in FIG. 3B. In this embodiment, the first glue material layer 320 is made from a glue material such as epoxy type glue, acrylic type glue or silicone type glue, but embodiments of the present invention are not limited thereto. The step 220 is performed by a tool including a platform configured to support the substrate 310. When the step 220 is performed, the platform touches the second surface 310b to support the substrate 310.

Figure 3C:
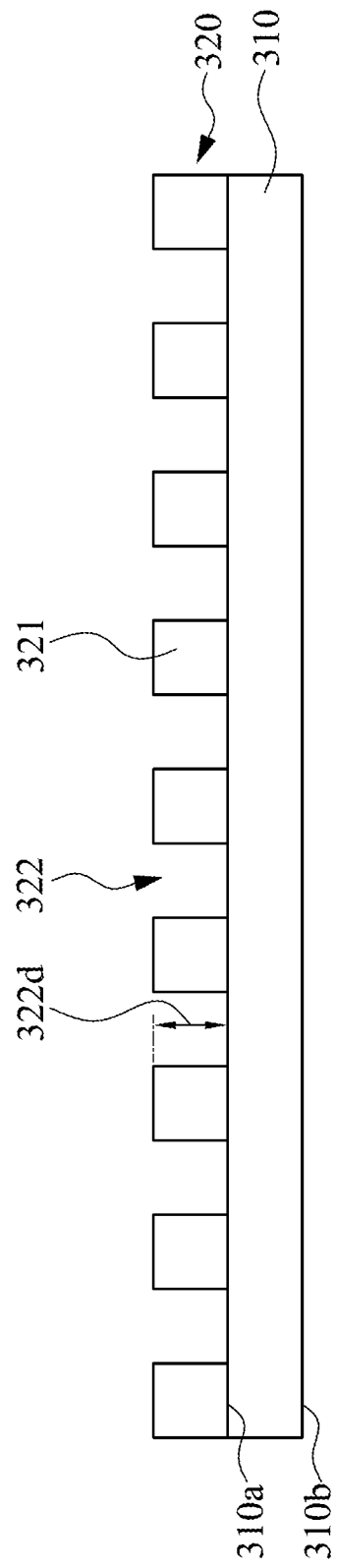

Thereafter, step 230 is performed to pattern the first glue material layer 320 to form a first diffractive structure layer (patterned first glue material layer 320), as shown in FIG. 3C. The first diffractive structure layer has micro structures including main portions 321 and openings 322 between the main portions 321, in which each of the openings 322 has a depth 322d. The first glue material layer 320 can be patterned by using lithography technology, such as nanoimprint technology. However, embodiments of the present invention are not limited thereto.

Figure 3D:
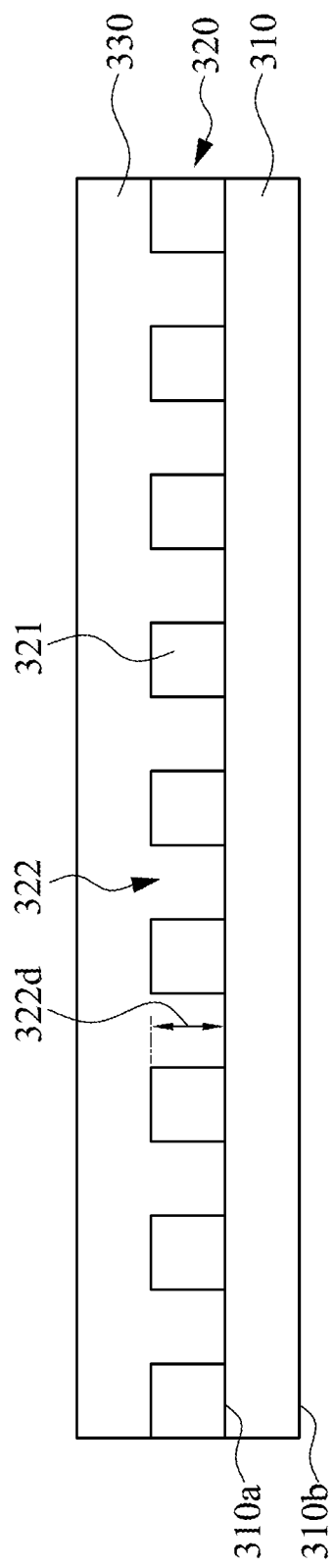

In some embodiments, the micro structures are designed for depressing noise at zero order. In some embodiments, the micro structures are designed for generating a desired light pattern on a target. Then, step 240 is performed to form a protection layer 330 on the first diffractive structure layer to protect the first diffractive structure layer, as shown in FIG. 3D. In this embodiment, the protection layer 330 is made from a glue material such as epoxy type glue, acrylic type glue or silicone type glue, but embodiments of the present invention are not limited thereto. Further, in some embodiments, a difference between a refractive index of the first diffractive structure layer (first glue material layer 320) and a refractive index of the protection layer 330 is bigger than 0.25, and the refractive index of the first diffractive structure layer is smaller than the refractive index of the protection layer 330.

Figure 3E:
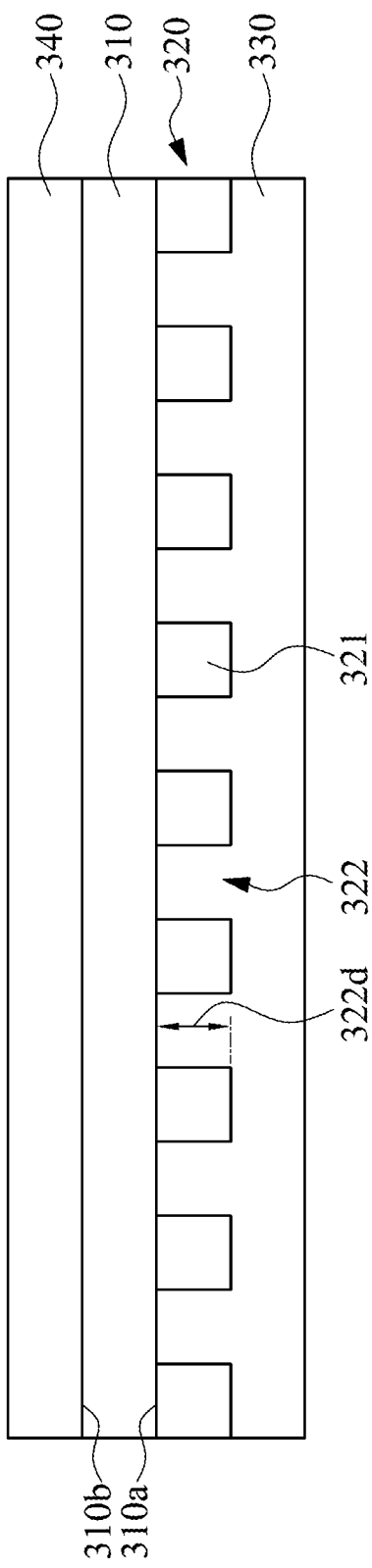

Then, step 250 is performed to form a second glue material layer 340 on the second surface 310b of the substrate 310, as shown in FIG. 3E. In this embodiment, the second glue material layer 340 is made from a glue material such as epoxy type glue, acrylic type glue or silicone type glue, but embodiments of the present invention are not limited thereto. In step 250, the substrate 310 is reversed and placed on the platform of the tool to benefit the formation of the second glue material layer 340 on the second surface 310b. Because the protection layer 330 covers the first diffractive structure layer formed on the first surface 310a, the platform of the tool touches the protection layer 330 to support the substrate 310, and it is prevented that the first diffractive structure layer is damaged by the platform of the tool.

Figure 3F:
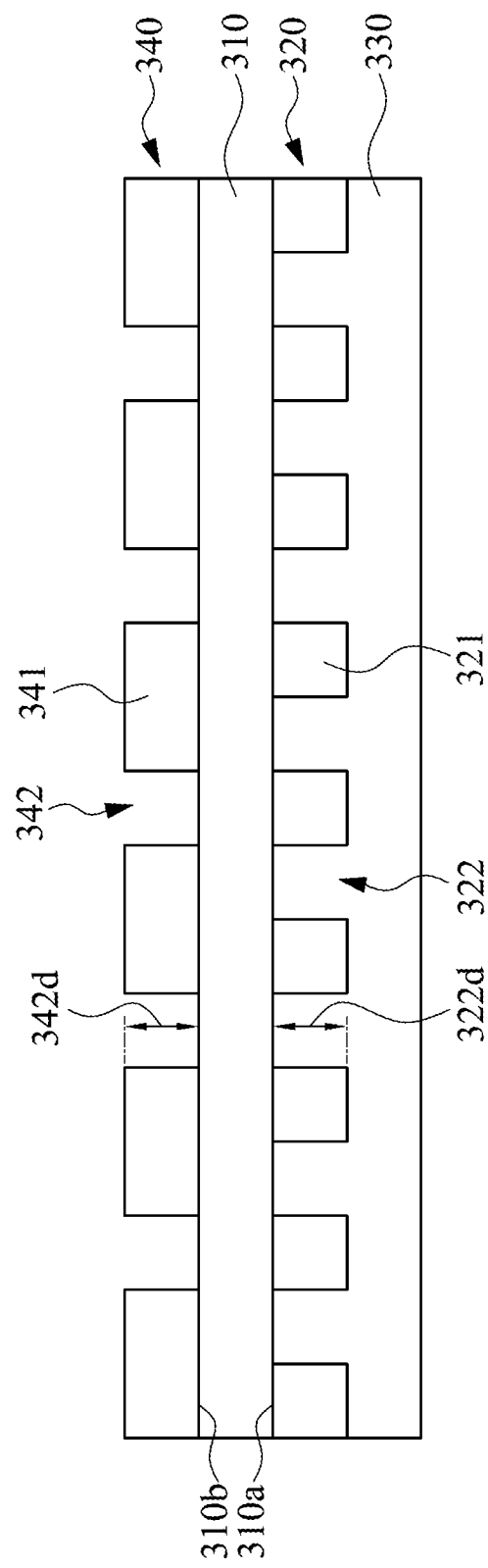

Thereafter, step 260 is performed to pattern the second glue material layer 340 to form a second diffractive structure layer (patterned second glue material layer 340), as shown in FIG. 3F. The second glue material layer 340 has micro structures including main portions 341 and openings 342 between the main portions 321, in which each of the openings 342 has a depth 342d. The second glue material layer 340 can be patterned by using lithography technology, such as nanoimprint technology. However, embodiments of the present invention are not limited thereto. In some embodiments, the micro structures are designed for depressing noise at zero order. In some embodiments, the micro structures are designed for generating a desired light pattern on a target.

Further, in some embodiments, the first glue material layer 320 can be replaced by a first semiconductor material containing layer, and the second glue material layer 340 can be replaced by a second semiconductor material containing layer. For example, the first semiconductor material containing layer can be formed on the first surface 310a of the substrate 310, and then patterned to form the first diffractive structure layer having the microstructures. For another example, the second semiconductor material containing layer can be formed on the second surface 310b of the substrate 310, and then patterned to form the second diffractive structure layer having the microstructures. In some embodiments, the material of the first semiconductor material containing layer and the second semiconductor material containing layer includes transparent a semiconductor material, such as silicon oxide or silicon nitride, but embodiments of the present invention are not limited thereto.

In addition, because the first semiconductor layer is stronger than the first glue material layer 320, step 240 for forming the protection layer 330 can be omitted.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for fabricating a diffractive optical element, wherein the diffractive optical element is configured to receive an incident light and output a diffracted light for performing a light diverging function to generate a desired light pattern on a target, and the method comprises:
   providing a substrate, wherein the substrate has a first surface and a second surface opposite to the first surface;
   forming a first semiconductor material containing layer on the first surface of the substrate;
   patterning the first semiconductor material containing layer to form a first diffractive structure layer on the first surface of the substrate;
   forming a second semiconductor material containing layer on the second surface of the substrate; and
   patterning the second semiconductor material containing layer to form a second diffractive structure layer on the second surface of the substrate;
   wherein one of the first diffractive structure layer and the second diffractive structure layer is configured to generate a portion of the desired light pattern, and an other one of the first diffractive structure layer and the second diffractive structure layer is configured to generate an other portion of the desired light pattern;
   wherein the first diffractive structure layer has a plurality of first openings and the second diffractive structure layer has a plurality of second openings, the first openings are aligned with the second openings, and all of the first openings and the second openings are formed to have a maximum depth allowed by lithography processes respectively performed on the first semiconductor material containing layer and the second semiconductor material containing layer.

2. The method of claim 1, further comprising reversing the substrate before forming the second semiconductor material containing layer, wherein a platform of a tool configured to form the second semiconductor material containing layer touches the first diffractive structure layer to support the substrate after reversing the substrate.

3. The method of claim 1, wherein patterning the first semiconductor material containing layer and patterning the second semiconductor material containing layer are performed by using nanoimprint technology.

* * * * *